(12) United States Patent
Chen et al.

(10) Patent No.: US 8,507,306 B2
(45) Date of Patent: Aug. 13, 2013

(54) REDUCED STICTION MEMS DEVICE WITH EXPOSED SILICON CARBIDE

(75) Inventors: Li Chen, Arlington, MA (US); Christine H. Tsau, Arlington, MA (US); Thomas Kieran Nunan, Carlisle, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 263 days.

(21) Appl. No.: 12/891,173

(22) Filed: Sep. 27, 2010

(65) Prior Publication Data

US 2011/0073859 A1   Mar. 31, 2011

Related U.S. Application Data

(60) Provisional application No. 61/246,325, filed on Sep. 28, 2009.

(51) Int. Cl.
*H01L 21/00* (2006.01)

(52) U.S. Cl.
USPC ............................................. 438/53; 257/414

(58) Field of Classification Search
USPC ............................... 257/414–419; 438/48–55
See application file for complete search history.

(56) References Cited

U.S. PATENT DOCUMENTS

| | | | |
|---|---|---|---|
| 5,429,708 A | 7/1995 | Linford et al. | 216/66 |
| 5,597,767 A | 1/1997 | Mignardi et al. | 437/227 |
| 5,662,771 A | 9/1997 | Stouppe | 438/52 |
| 5,694,740 A | 12/1997 | Martin et al. | 53/431 |
| 6,859,542 B2 | 2/2005 | Johannsen et al. | 381/174 |
| 6,953,977 B2 * | 10/2005 | Mlcak et al. | 257/414 |
| 7,364,942 B2 | 4/2008 | Martin | 438/106 |

FOREIGN PATENT DOCUMENTS

CN   1167342 A   12/1997

OTHER PUBLICATIONS

Sarro et al., "Silicon carbide as a new MEMS technology", Sensors and Actuators 82 (2000).*
Gao, D., et al., "Polycrystalline Silicon Carbide as a Substrate Material for Reducing Adhesion in MEMS," *Tribology Letters*, vol. 21, No. 3, Mar. 2006, pp. 226-232.
Sarro, P., "Silicon Carbide as a New MEMS Technology," *Sensors and Actuators* 82 (2000), pp. 210-218.
Wang, K., et al., "Stable SuperHydrophobic Composite Coatings Made From an Aqueous Dispersion of Carbon Nanotubes and a Fluoropolymer," *Carbon*, vol. 49, pp. 1769-1774, 2011 [1522315].
Ramé-Hart, Information on Contract Angle (Ramé-Hart) 1961-2011 50th Anniversary, 4 pages, printed 2011.

* cited by examiner

*Primary Examiner* — Julio J Maldonado
*Assistant Examiner* — Sonya D McCall Shepard
(74) *Attorney, Agent, or Firm* — Sunstein Kann Murphy & Timbers LLP (57) ABSTRACT

A MEMS device has a first member that is movable relative to a second member. At least one of the first member and the second member has exposed silicon carbide with a water contact angle of greater than about 70 degrees.

19 Claims, 5 Drawing Sheets

REDUCED STICTION MEMS DEVICE WITH EXPOSED SILICON CARBIDE

PRIORITY

This patent application claims priority from provisional U.S. patent application Ser. No. 61/246,325, filed Sep. 28, 2009, entitled, "Reduced Stiction MEMS Device with Exposed Silicon Carbide," and naming Li M. Chen, Christine Tsau, Thomas Kieran Nunan, and Kuang Yang as inventors, the disclosure of which is incorporated herein, in its entirety, by reference.

TECHNICAL FIELD

The invention generally relates to MEMS devices and, more particularly, the invention relates to reducing stiction in MEMS devices.

BACKGROUND ART

Spaced apart, movable components often undesirably stick together during the release step of the MEMS fabrication process. For example, a finished MEMS device may have a movable member that is spaced from and suspended above an underlying substrate. Prior to release, the movable member may be immovable and spaced from the substrate by an intervening sacrificial oxide layer. To release the movable member, the process may immerse the partially fabricated device in a liquid acid bath, which removes the oxide layer. The liquid surface tension of the acid, however, often causes the movable member to stick to the substrate. This phenomenon, which is known in the art as "stiction," reduces fabrication yields.

Stiction also can present a problem during use. For example, a MEMS microphone, which often is exposed to the environment, may develop moisture between its movable member (its diaphragm) and its substrate (its backplate).

Those in the art have responded to this problem with a number of different solutions. One such solution coats the exposed surface with a polymer or monomer material. Undesirably, such a material often is not robust and can degrade, consequently causing reliability issues. Other solutions require extensive additions to the fabrication process, thus increasing cost.

SUMMARY OF THE INVENTION

Various embodiments provide reduced stiction in a MEMS device. To that end, some embodiments include a process of fabricating a MEMS device by providing a substrate having a first surface and fabricating a movable member on that surface. The process also uses PECVD to provide a layer of silicon carbide ("SiC") on at least one of the first surface or an opposing surface of the movable member. Alternate embodiments fabricate a first silicon carbide layer on the first surface, and then deposit a sacrificial layer on that silicon carbide layer. The movable member is then fabricated on the sacrificial layer before the sacrificial layer is removed to release the movable layer. Some embodiments fabricate a second silicon carbide layer between the sacrificial layer and the movable member, while others fabricate the sacrificial layer directly on the substrate without the intervening first silicon carbide layer. Other embodiments pattern a silicon carbide layer before release, or before other structures are fabricated above the silicon carbide layer.

In accordance with another embodiment, a MEMS device has a first member that is movable relative to a second member. At least one of the first member and the second member has exposed silicon carbide with a water contact angle of greater than about 70 degrees.

The first member may include a backplate while the second member may include a corresponding flexible diaphragm, thus forming a microphone.

The first member may be formed from polysilicon and silicon carbide. For example, the first member may have a base layer of polysilicon and a thinner layer of silicon carbide. Rather than having some other material (e.g., polysilicon) as a base layer, the first member may have a base layer of silicon carbide that is exposed. Alternatively, the first member may be formed from single crystal silicon and a thinner layer of silicon carbide.

The first and second members may have respective first and second facing surfaces, where at least one of those surfaces has the exposed silicon carbide. At least one of those surfaces may have a water contact angle of greater than or equal to about 70 degrees.

Among other things, the exposed silicon carbide may be selected from the group of amorphous silicon carbide and single crystal silicon carbide.

In accordance with another embodiment of the invention, a MEMS device has a substrate having a top surface, and a movable member adjacent to and spaced from the substrate. The movable member has a bottom surface facing the top surface of the substrate. In illustrative embodiments, at least one of the top surface and bottom surface has exposed silicon carbide with a water contact angle greater than about 70 degrees.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

In illustrative embodiments, a MEMS device has at least one exposed surface that is less likely to be subjected to stiction problems than prior art counterparts. To that end, the MEMS device has an exposed silicon carbide ("SiC") surface having a surface energy that is low enough to minimize stiction problems. For example, the surface may have a water contact angle of greater than about 75 or 80 degrees. The surface is part of either a movable member or stationary microstructure adjacent to a movable member. Details of illustrative embodiments are discussed below.

Figure 1:
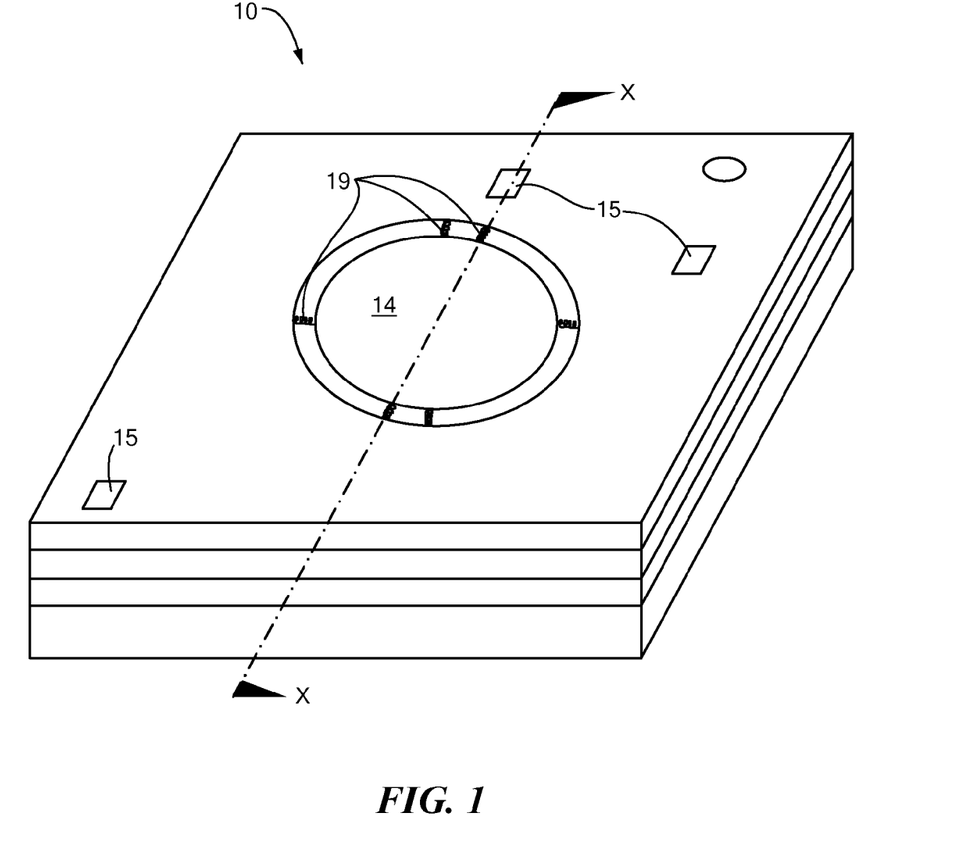
FIG. 1 schematically shows a perspective view of a MEMS device that may be configured in accordance with illustrative embodiments of the invention.

FIG. 1 schematically shows a top, perspective view of a MEMS device that may be configured in accordance with illustrative embodiments of the invention. Specifically, as noted above, the MEMS device of FIG. 1 has specially configured microstructure that is less susceptible to stiction problems.

The inventors believe that various embodiments of the invention can apply to numerous different types of MEMS devices. For example, among other things, various embodiments may apply to inertial sensors (e.g., accelerometers and gyroscopes), pressure sensors, optical relays, contact switches, and microphones. For simplicity, the figures and discussion below relate primarily to microphones. Those skilled in the art, however, should understand that various embodiments are not limited to microphones and thus, can apply to other MEMS devices.

Figure 2A:
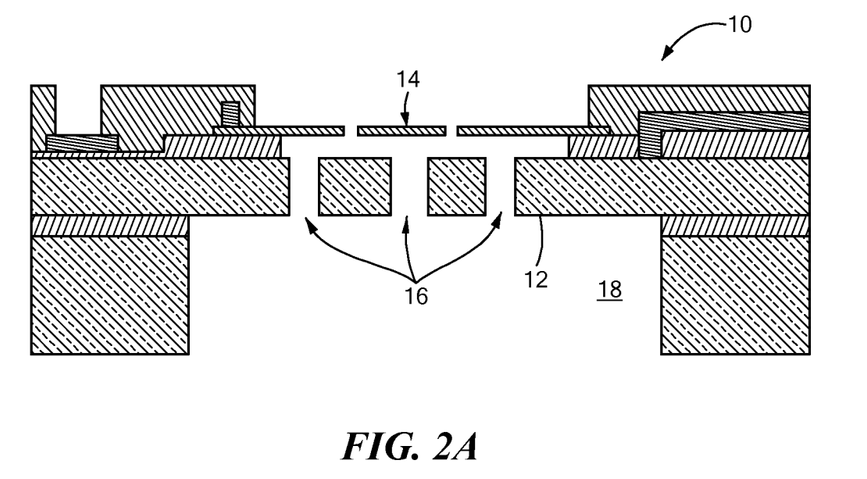
FIG. 2A schematically shows a cross-sectional view across line X-X of the MEMS device shown in FIG. 1 in accordance with a first embodiment of the invention.
Figure 2B:
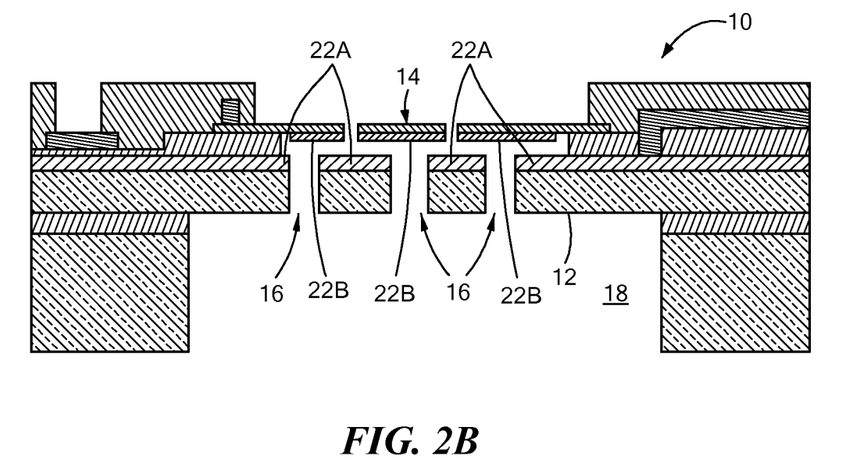
FIG. 2B schematically shows a cross-sectional view across line X-X of the MEMS device shown in FIG. 1 in accordance with a second embodiment of the invention.

FIG. 1 therefore more specifically shows a MEMS microphone (also referred to as a "microphone chip 10") that may be configured in accordance illustrative embodiments of the invention. FIG. 2A schematically shows a cross-section of the same microphone 10 across line X-X of FIG. 1 in accordance with a first embodiment of the invention. In a corresponding manner, FIG. 2B schematically shows a cross-section of the same microphone 10 across line X-X of FIG. 1 in accordance with a second embodiment of the invention.

Among other things, the microphone 10 includes a static backplate 12 that supports and forms a capacitor with a flexible diaphragm 14. In illustrative embodiments, the backplate 12 is formed at least in part from single crystal silicon (e.g., the top layer of a silicon-on-insulator wafer), while the diaphragm 14 is formed at least in part from deposited polysilicon. For example, the backplate 12, diaphragm 14, or both can have a layer of single crystal and/or amorphous silicon carbide on their respective exposed, facing surfaces (discussed below). Other embodiments, however, use other types of materials to form the backplate 12 and the diaphragm 14. For example, a single crystal silicon bulk wafer, or some deposited material may at least in part form the backplate 12. In a similar manner, a single crystal silicon bulk wafer, part of a silicon-on-insulator wafer, or some other deposited material may form at least part of the diaphragm 14. To facilitate operation, the backplate 12 has a plurality of through-holes 16 that lead to a backside cavity 18.

Springs 19 movably connect the diaphragm 14 to the static portion of the microphone 10, which includes a substrate that in part forms the backplate 12. Acoustic signals cause the diaphragm 14 to vibrate, thus producing a changing capacitance. On-chip or off-chip circuitry (not shown) receives (via contacts 15) and converts this changing capacitance into electrical signals that can be further processed. It should be noted that discussion of the specific microphone 10 shown in FIGS. 1, 2A, and 2B is for illustrative purposes only. Various embodiments thus may use other microphone configurations.

In accordance with illustrative embodiments of the invention, selected portions/surfaces of the microstructure within the microphone 10 are specially configured to have a relatively low surface energy. Specifically, for a microphone, two of the surfaces that traditionally could be more susceptible to stiction include the facing surfaces of the diaphragm 14 and the backplate 12. For this and other applications, configuring one or both such surfaces to have a water contact angle that is greater than a relatively low number should suffice. For example, water contact angles greater than about 70 or 75 degrees may suffice (e.g., a water contact angle of about 80-90 degrees).

Prior art systems increase the hydrophobicity of the surface in a number of ways, including adding a layer of Teflon. Such a technique, however, requires additional components and steps to implement. In fact, many such techniques may have reliability problems. After experimentation, the inventors discovered that an inorganic material, silicon carbide, should provide satisfactory anti-stiction benefits when formed on exposed surfaces between MEMS microstructure. Specifically, silicon carbide has a water contact angle that provides sufficient hydrophobicity for a number of MEMS applications, such as a microphone. The inventors believe that amorphous silicon carbide or single crystal silicon carbide should provide sufficient anti-stiction properties, having water contact angles of greater than about 80 degrees. As an additional benefit, the relatively low processing temperatures of amorphous silicon carbide facilitate its use with on-chip circuitry (e.g., CMOS circuitry). This is in direct contrast to polysilicon carbide, which has high processing temperatures.

Silicon carbide can make up substantially the core or substantially the entire microstructure in question (e.g., see FIG. 2A, which shows the microstructure being primarily formed from silicon carbide), or just be an exposed layer (e.g., See FIG. 2B). To those ends, FIG. 2A schematically shows one embodiment, in which both the diaphragm 14 and backplate 12 are formed primarily from amorphous or single crystal silicon carbide. In other words, the diaphragm 14 and backplate 12 are formed mostly from amorphous or single crystal silicon carbide.

FIG. 2B schematically shows another embodiment, in which the diaphragm 14 is primarily formed from polysilicon, and the backplate 12 is primarily formed from single crystal silicon. This embodiment also has a relatively thin layer 22A of silicon carbide (either amorphous or single crystal silicon carbide) on the top facing surface of the backplate 12, and another relatively thin layer 22B of silicon carbide on the bottom facing surface of the diaphragm 14.

Other embodiments combine aspects of the embodiments of FIGS. 2A and 2B. Specifically, in one embodiment, the diaphragm 14 is formed primarily from polysilicon and has no exposed silicon carbide, while the backplate 12 is formed primarily from silicon carbide. In another embodiment, the diaphragm 14 is formed primarily from silicon carbide, while the backplate 12 is formed from single crystal silicon. Other permutations are available, such as one microstructure having an exposed thin layer 22A or 22B of silicon carbide, such as in FIG. 2B, while another microstructure is formed primarily from silicon carbide, such as shown in FIG. 2A.

Accordingly, the exposed surfaces between the microstructure in the embodiments of FIGS. 2A and 2B (and other related permutations) should have a relatively low surface energy, thus mitigating stiction issues. In addition, they should be relatively robust due to their compatibility with the rest of the materials forming the MEMS device.

Figure 2C:
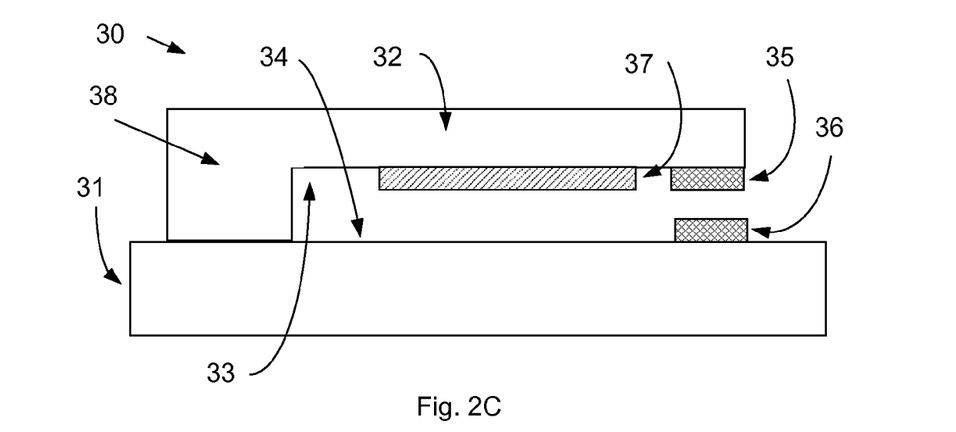
FIG. 2C schematically shows a cantilever with a SiC area on its underside.

An embodiment as applied to a MEMS microswitch 30 is schematically illustrated in FIG. 2C. Among other things, the MEMS microswitch includes a base or substrate 31, and a cantilevered switch member 32 suspended from and substantially parallel to the substrate 31. The underside 33 of the cantilevered switch member 32 faces the surface 34 of the substrate 31. Either the substrate 31, the switch member, or both may be formed from single crystal silicon, or polysilicon.

The cantilevered switch member 32 includes a switch electrode 35 that, in FIG. 2C, is suspended above a substrate electrode 36. The cantilevered switch member 32 is flexible, and may be drawn or forced to bend towards the substrate 31 by actuator means known in the art, including electrostatic or thermal deflection, for example. When the cantilevered switch member 32 is bent towards the substrate 31, the switch electrode 35 makes physical and electrical contact with the substrate electrode 36.

In this position, the cantilevered switch member 32 presents a risk of stiction with the substrate 31. Accordingly, in the illustrative embodiment of FIG. 2C, the underside 33 of the cantilevered switch member 32 includes a SiC layer 37 along a portion of its length. The SiC layer 37 does not extend across the switch electrode 35, and thereby does not interfere with electrical contact between the switch electrode 35 and the substrate electrode 36. Similarly, the SiC layer does not extend to the base region 37 of the cantilevered switch member 32, so as not to hamper the flexibility of that member.

Figure 2D:
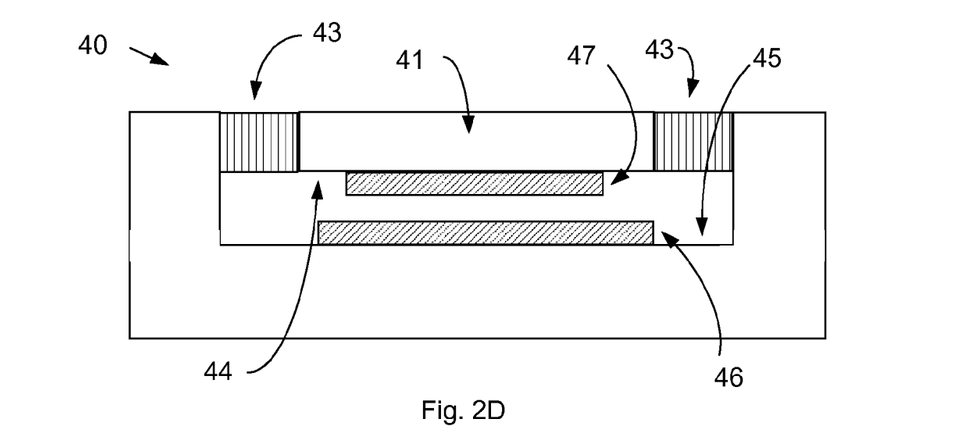
FIGS. 2D and 2E schematically show views a MEMS inertial sensor with opposing SiC areas.

A cross-section of a MEMS inertial sensor 40 is schematically illustrated in FIG. 2D. The inertial sensor 40 may be an accelerometer that detects acceleration in one, two, or even three axes, or may be a gyroscope that detects coriolis forces, for example.

The MEMS inertial sensor includes a mass or beam 41 suspended in a plane above a substrate 42 by springs 43. The springs 43 allow the beam 41 to move relative to the substrate 42 in response to forces such as acceleration. Some MEMS inertial sensors allow the beam 41 to move within the plane, and those motions are detected by, for example, capacitive sensing fingers fixed to the substrate 42 and surrounding the beam 41. Other MEMS inertial sensors allow the beam 41 to move perpendicular to the substrate 42, and the variable distance between the beam and substrate may be measured a changing capacitance between them.

Figure 2E:
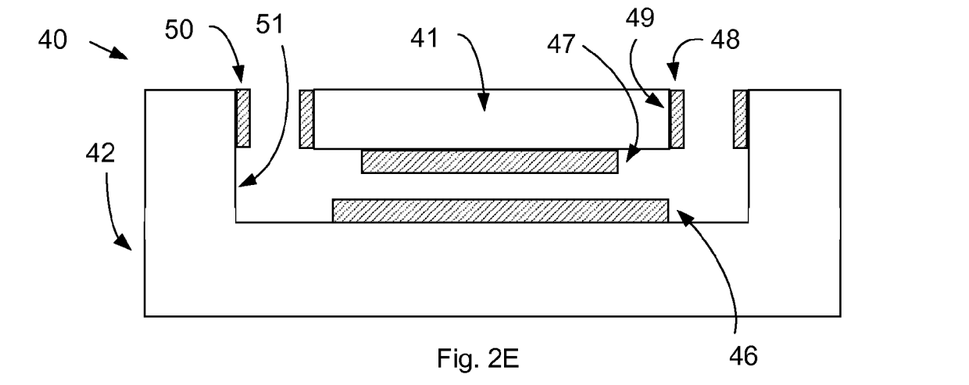

The suspension of the beam 41 presents a risk of stiction between the bottom face 44 of the beam 41 and the surface 45 of the substrate 42, or between a side of the beam 49 and a sidewall 51. To mitigate this risk, the bottom face 44 of the beam 41 and/or the surface 45 of the substrate 42 may contain a SiC region. In FIG. 2D, a first SiC region 46 covers the surface 45 of the substrate 42 beneath the beam 41, while a second SiC region 47 covers a portion of the bottom face 44 of the beam 41. The portion of the bottom face of the beam covered by the second SiC region may be selected based on the proximity of the bottom face to the opposing surface. In FIG. 2D, the second SiC region 47 does not extend to the springs 43, so as not to hamper the flexibility of the springs. As such, the second SiC layer 47 is selectively provided on the bottom side 44 of the beam. Alternately, or in addition, some embodiments include a SiC region 48 on a side 49 of the beam 41, or a SiC region 50 on a sidewall 51 of the substrate 42, or both, as schematically illustrated in FIG. 2E.

Figure 3:
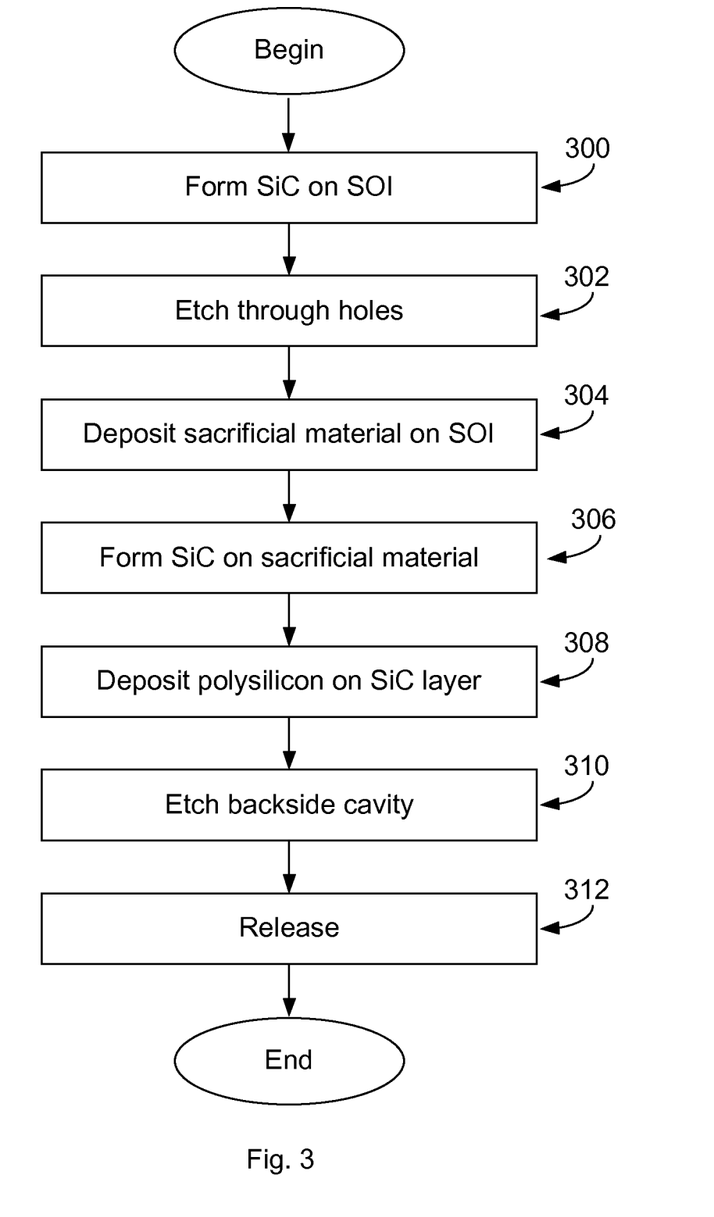
FIG. 3 shows a process of forming the MEMS device in accordance with illustrative embodiments of the invention.

FIG. 3 shows a process of forming the MEMS microphone 10 shown in FIG. 2B in accordance with illustrative embodiments. It should be noted that this process can be applied to other embodiments, such as those that are similar to the devices shown in either FIG. 2A or 2B. It also should be noted that this process is a summary of a much longer process and thus, may omit certain steps. In addition, this process may perform some of the steps in an order that is different than that discussed. For example, certain steps may be implemented substantially simultaneously, or in a different order than that discussed.

It also should be noted that this process is discussed as fabricating a single MEMS device. However, those skilled in the art can apply this process to batch processes, which simultaneously form a plurality of MEMS devices a on a single wafer. Accordingly, the discussion concerning fabrication of a single MEMS device should not limit batch processing embodiments.

The process begins at step 300, which forms a silicon carbide layer on the top, exposed surface of a silicon on insulator wafer (known in the art as an "SOI wafer." This top surface is part of the thin, so-called "device layer" of the SOI wafer. Any of a number of different conventional processes may form the silicon carbide layer. For example, among other things, ion assist deposition, low pressure chemical vapor deposition (LPCVD), or plasma enhanced chemical vapor deposition (PECVD) may deposit the silicon carbide onto the SOI wafer.

As noted above, the silicon carbide preferably comprises single crystal silicon carbide or amorphous silicon carbide. For single crystal silicon carbide, for example, layer transfer processes may form such layer. The thickness of the silicon carbide layer 22A depends on the application. For example, the layer 22A may have a thickness of about 2000-4000 angstroms.

Next, the process etches through-holes 16 through the silicon carbide layer 22A and top wafer of the SOI wafer (step 302). This step uses the buried insulator layer as an etch stop. Sacrificial material, such as oxide, then may be deposited onto the SOI wafer, filling the through-holes 16 and covering the top silicon carbide layer 22A (step 304). This sacrificial material temporarily supports the soon to be formed diaphragm 14.

Before depositing diaphragm material, however, the process forms another thin layer 22B of silicon carbide on the sacrificial layer (step 306). Any of the processes noted above with respect to step 300 should suffice. In a manner similar to the prior formed silicon carbide layer 22A, this layer 22B may have a thickness of between about 2000-4000 angstroms.

The process then deposits a layer of polysilicon at step 308, thus forming the diaphragm 14. In alternative embodiments, the process may use layer transfer processes to form the diaphragm 14 and the second silicon carbide layer 22B. For example, layer transfer processes may form the diaphragm 14 and second layer 22B separately from the SOI wafer, and then couple it after it is formed. For additional information regarding layer transfer processes in the MEMS context, see, for example, co-pending, co-owned provisional patent application Ser. Nos. 61/238,014 and 61/237,982, and utility applications Ser. Nos. 12/870,288 and 12/870,266, the disclosures of which are incorporated herein, in their entireties, by reference.

After etching the backside cavity 18 at step 310, the process concludes with step 312 by releasing the diaphragm 14. To that end, the process may use an acid etch (e.g., in a hydrofluoric acid bath) to remove the oxide from within the through-holes 16 and beneath the diaphragm 14.

Release of the microstructure is one time when stiction could occur—the diaphragm 14 could stick to the substrate when removed from the bath. Use of the exposed silicon carbide layer(s) 22A and 22B should reduce this possibility, thus producing a greater unit yield. Stiction also can occur during use. The exposed silicon carbide layer(s) 22A and 22B thus also should reduce this possibility.

Figure 4:
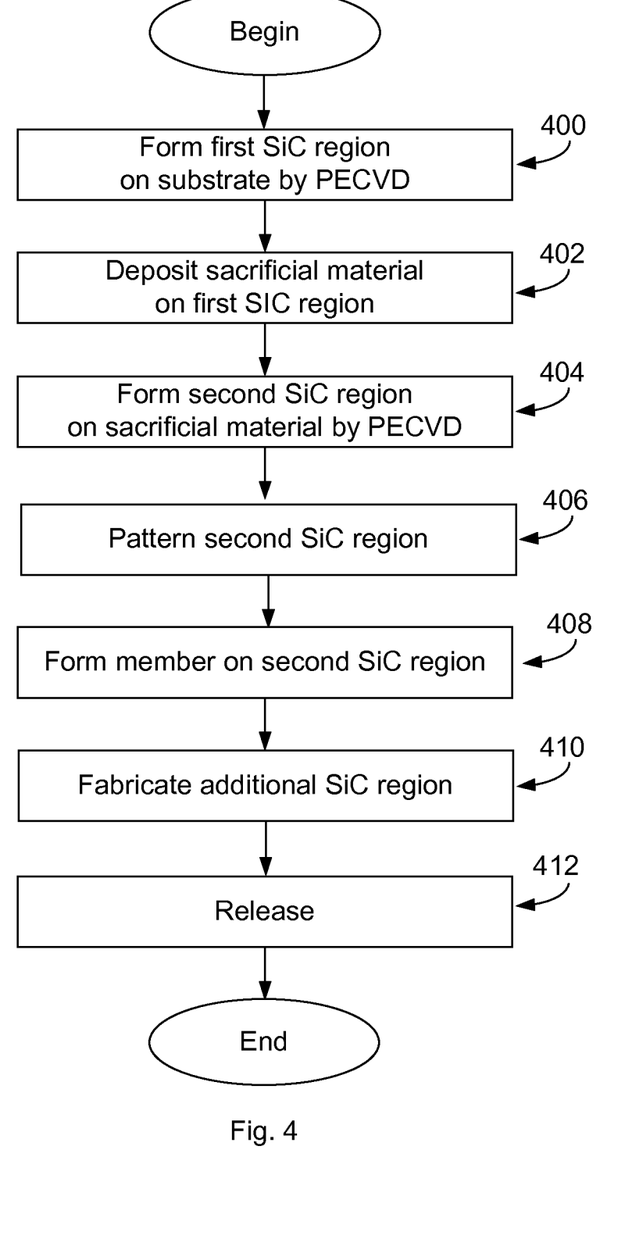
FIG. 4 shows a process of forming the MEMS device using PECVD in accordance with illustrative embodiments of the invention.

FIG. 4 shows a process of forming the MEMS inertial sensor, such as those illustrated in FIG. 2C and 2D, for example. The process begins by forming a first SiC region on the surface of a substrate (step 400), if the inertial sensor is to have such a SiC region (e.g., first SiC region 46 in FIG. 2D). This step may be skipped if the MEMS devices does not have a SiC layer on the substrate (e.g., as in the MEMS microswitch schematically illustrated in FIG. 2C).

In illustrative embodiments, the first SiC region is deposited by a PECVD process, though other processes may be substituted. Through this process, the first SiC layer has a surface roughness that facilitates a higher water contact angle than some other processes. For example, it has been reported that a poly-SiC layer deposited on a substrate by a LPCVD process has about the same roughness as a poly-SI layer, although the two layers had significantly different topographies (see Polycrystalline Silicon Carbide As A Substrate Material For Reducing Adhesion of MEMS, by Gao et al, Tribology Letters, Vol. 21, No. 3, Mar. 2006, pp 226-232). As a consequence, the LPCVD-deposited poly-SiC produced a low (undesirable) water contact angle ranging from about sixty degrees to as low as ten degrees.

In contrast, silicon carbide deposited by PECVD may produce a water contact angle in excess of 80 degrees, or greater. The inventors have found a correlation between the roughness of the SiC surface and its water contact angle. Specifically, the rougher the surface of a SiC layer, the higher (and more desirable) the water contact angle. Of course, in some embodiments the substrate of a MEMS device, and/or MEMS structures themselves may be made of SiC, as opposed to merely supporting a layer of SiC on an exposed surface.

The first SiC layer may cover the entire surface of the substrate, or may be patterned to cover only portions of the substrate, for example in places where there is a higher perceived risk of stiction, as determined by the application and design of the MEMS device. Accordingly, the step of forming the first SiC region may involve patterning the SiC material by methods known in the art.

The process continues by adding a sacrificial layer on the first SiC region (step 402), or if there is no first SiC region, the on the surface of the substrate. The sacrificial material will support subsequently fabricated structures, but later will be removed to release the structures with respect to each other. If subsequently fabricated structures contact or are based on the substrate (such as the base 37 of the cantilevered structure 32 in FIG. 2C, for example), the sacrificial material and/or the SiC material may be patterned to provide an opening for that MEMS structure.

A second SiC region is subsequently deposited on the sacrificial layer at step 404, by a PECVD process, if the MEMS device is to have a SiC layer on structures above the substrate (such as the cantilevered member 32 in FIG. 2C, and the beam 41 in FIG. 2D, for example). Otherwise, step 404 may be omitted.

The second SiC layer may be patterned prior to fabrication of subsequent structures (step 406). For example, portions of the second SiC layer may be removed near an electrode as in FIG. 2C, or near a flexible member, such as the base of cantilevered member in FIG. 2C, or a flexure or spring as in FIG. 2D).

Next, a MEMS structure is fabricated on the second SiC layer, if present, or on the sacrificial layer (step 408). The MEMS structure may be a cantilevered member 37 as in FIG. 2C, or a beam 41 as in FIG. 2D, for example. The MEMS structure may be fabricated in a variety of ways known in the art, such as deposition of polysilicon, or by a layer transfer of a crystalline silicon structure initially formed on another substrate, to name but a few. In some embodiments, a SiC region is fabricated on the MEMS structure or on an opposing portion of the substrate (step 410), such as on the side 49 of the beam 41 or opposing sidewall 51, as schematically illustrated in FIG. 2E for example.

In some embodiments, a polysilicon or SiC MEMS structure may be formed by a LPCVD process, even when the one or more SiC layers are formed by a PECVD process.

Finally, the sacrificial material is removed to release the MEMS structure (step 412). The removal of the sacrificial material leaves the one or more SiC regions behind, located between a MEMS structure and an opposing surface of the substrate. The presence of the one or more SiC regions will reduce the risk and severity of stiction between these parts of the MEMS device.

Accordingly, illustrative embodiments use silicon carbide to form one or more exposed surfaces with water contact angles that minimize the likelihood of stiction (e.g., greater than about 70 or 75 degrees). Silicon carbide also is compatible with conventional MEMS micromachining processes and thus, should not require extensive additional equipment or steps to integrate into the process.

Moreover, silicon carbide is a robust material and should not wear or degrade as easily as prior art layers (e.g., Teflon). Finally, unlike polysilicon carbide, single crystal and amorphous silicon carbide favorably can be deposited at relatively low temperatures (e.g., less than about 400 degrees C.). Accordingly, heat sensitive components, such as CMOS circuitry, may be formed on the SOI wafer with a reduce risk of damage.

Although the above discussion discloses various exemplary embodiments of the invention, it should be apparent that those skilled in the art can make various modifications that will achieve some of the advantages of the invention without departing from the true scope of the invention.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A MEMS device comprising:
a first member comprising a backplate; and
a second member comprising a flexible diaphragm, the first member being movable relative to the second member such that the diaphragm and backplate form a microphone,
at least one of the first member and the second member comprising exposed silicon carbide having a water contact angle of greater than about 70 degrees.

2. A MEMS device comprising:
a first member comprising polysilicon; and
a second member, the first member being movable relative to the second member,
the first member further comprising exposed silicon carbide having a water contact angle of greater than about 70 degrees.

3. The MEMS device as defined by claim 2 wherein the first member comprises a base layer of polysilicon and a thinner layer of silicon carbide.

4. The MEMS device defined by claim 1 wherein the first member comprises a base layer of silicon carbide, the silicon carbide being exposed.

5. A MEMS device comprising:
a first member comprising single crystal silicon; and
a second member, the first member being movable relative to the second member,
the first member further comprising exposed silicon carbide having a water contact angle of greater than about 70 degrees.

6. A MEMS device comprising
a first member comprising a base layer of single crystal silicon and a thinner layer of exposed silicon carbide; and a second member, the first member being movable relative to the second member, the exposed silicon carbide having a water contact angle of greater than about 70 degrees.

7. The MEMS device as defined by claim 1 wherein the first member has a first surface, the second member having a second surface, the first surface facing the second surface, at least one of the first surface and second surface having the exposed silicon carbide.

8. The MEMS device as defined by claim 7, each of the first surface and second surface having the exposed silicon carbide.

9. The MEMS device as defined by claim 1 wherein the first member has a first surface, the second member having a second surface, the first surface facing the second surface, at least one of the first surface and second surface having a water contact angle of greater than or equal to about 70 degrees.

10. The MEMS device as defined by claim 1 wherein the exposed silicon carbide is selected from the group of amorphous silicon carbide and single crystal silicon carbide.

11. The MEMS device as defined by claim 2 wherein the first member has a first surface, the second member having a second surface, the first surface facing the second surface, each of the first surface and second surface having exposed silicon carbide.

12. The MEMS device as defined by claim 2 wherein the first member has a first surface, the second member having a second surface, the first surface facing the second surface, at least one of the first surface and second surface having a water contact angle of greater than or equal to about 70 degrees.

13. The MEMS device as defined by claim 2 wherein the exposed silicon carbide is selected from the group of amorphous silicon carbide and single crystal silicon carbide.

14. The MEMS device as defined by claim 5 wherein the first member has a first surface, the second member having a second surface, the first surface facing the second surface, each of the first surface and second surface having exposed silicon carbide.

15. The MEMS device as defined by claim 5 wherein the first member has a first surface, the second member having a second surface, the first surface facing the second surface, at least one of the first surface and second surface having a water contact angle of greater than or equal to about 70 degrees.

16. The MEMS device as defined by claim 5 wherein the exposed silicon carbide is selected from the group of amorphous silicon carbide and single crystal silicon carbide.

17. The MEMS device as defined by claim 6 wherein the first member has a first surface, the second member having a second surface, the first surface facing the second surface, each of the first surface and second surface having exposed silicon carbide.

18. The MEMS device as defined by claim 6 wherein the first member has a first surface, the second member having a second surface, the first surface facing the second surface, at least one of the first surface and second surface having a water contact angle of greater than or equal to about 70 degrees.

19. The MEMS device as defined by claim 6 wherein the exposed silicon carbide is selected from the group of amorphous silicon carbide and single crystal silicon carbide.

* * * * *